US009490779B2

(12) United States Patent
Giridhar et al.

(10) Patent No.: US 9,490,779 B2
(45) Date of Patent: Nov. 8, 2016

(54) DYNAMIC CIRCUITRY USING PULSE AMPLIFICATION TO REDUCE METASTABILITY

(71) Applicant: The Regents of the University of Michigan, Ann Arbor, MI (US)

(72) Inventors: Bharan Giridhar, Ann Arbor, MI (US); Matthew Rudolph Fojtik, Ann Arbor, MI (US); David Alan Fick, Ann Arbor, MI (US); Dennis Michael Sylvester, Ann Arbor, MI (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 783 days.

(21) Appl. No.: 13/940,864

(22) Filed: Jul. 12, 2013

(65) Prior Publication Data
US 2015/0015305 A1 Jan. 15, 2015

(51) Int. Cl.
| | |
|---|---|
| *H03K 19/003* | (2006.01) |
| *H03K 3/037* | (2006.01) |
| *H03K 5/13* | (2014.01) |
| *H03K 5/135* | (2006.01) |

(52) U.S. Cl.
CPC ............ *H03K 3/0375* (2013.01); *H03K 5/133* (2013.01); *H03K 5/135* (2013.01)

(58) Field of Classification Search
USPC ..................................................... 326/93, 94
See application file for complete search history.

(56) References Cited

U.S. PATENT DOCUMENTS

| | | | | | |
|---|---|---|---|---|---|
| 4,933,571 | A | * | 6/1990 | Pribyl | .............. H03K 3/356104 326/95 |
| 5,418,407 | A | * | 5/1995 | Frenkil | ................ H03K 3/0372 327/141 |
| 5,654,988 | A | * | 8/1997 | Heyward | .............. H04L 7/0012 326/93 |
| 5,764,710 | A | * | 6/1998 | Cheng | ....................... H04L 7/02 327/154 |
| 7,977,975 | B1 | * | 7/2011 | Lewis | .................. H03K 3/0375 326/27 |

OTHER PUBLICATIONS

J. Howard et al, "A 48-Core IA-32 Processor in 45 nm CMOS Using On-Die Message-Passing and DVFS for Performance and Power Scaling" *IEEE Journal of Solid-State Circuits*, vol. 46, No. 1, Jan. 2011, pp. 173-183.
S. Dighe et al, "Within-Die Variation-Aware Dynamic-Voltage-Frequency-Scaling With Optimal Core Allocation and Thread Hopping for the 80-Core TeraFLOPS Processor" *IEEE Journal of Solid-State Circuits*, vol. 46, No. 1, Jan. 2011, pp. 184-193.

(Continued)

*Primary Examiner* — Don Le
(74) *Attorney, Agent, or Firm* — Pramudji Law Group PLLC; Ari Pramudji

(57) ABSTRACT

Synchronisation circuitry 2 comprises a first dynamic circuit stage 4 generating a first stage state signal which is pulse amplified by pulse amplifying circuitry 8 to generate a pulse amplified signal. The pulse amplified signal is supplied to a second dynamic circuit stage 6 where it is used to control generation of a second stage state signal. The pulse amplifying circuitry 8 comprises a chain of serially connected skewed inverters 20, 22. The action of the pulse amplifying circuitry 8 is to reduce the probability of metastability in the output of the second dynamic stage 6.

19 Claims, 5 Drawing Sheets

XCK1= input signal
G1 = first circuit stage
Y1 = first stage state signal
PAC = pulse amplifying circuitry
Y1_a = pulse amplified signal
G2 = second circuit stage
Y2 = output signal

(56) References Cited

OTHER PUBLICATIONS

Z. Yu et al, "An 800MHz 320mW 16-Core Processor with Message-Passing and Shared-Memory Inter-Core Communication Mechanisms" *ISSCC Dig. Tech. Papers*, Feb. 2012, pp. 64-66.

A. Shibayama et al, "Skew-Tolerant Global Synchronization Based on Periodically All-in-Phase Clocking for Multi-Core SOC Platforms" *IEEE Symposium on VLSI Circuits Digest of Technical Papers*, Jun. 2007, pp. 158-159.

P. Caputa et al, "An On-Chip Delay- and Skew-Insensitive Multi-Cycle Communication Scheme" *ISSCC Dig. Tech. Papers*, Feb. 2006, pp. 1765-1774.

J. Zhou et al, "On-Chip Measurement of Deep Metastability in Synchronizers" *IEEE Journal of Solid-State Circuits*, vol. 43, No. 2, Feb. 2008, pp. 550-557.

R. Ginosar, "Fourteen Ways to Fool Your Synchronizer" *IEEE SYNC 2003*, May 2003, pp. 89-96.

\* cited by examiner

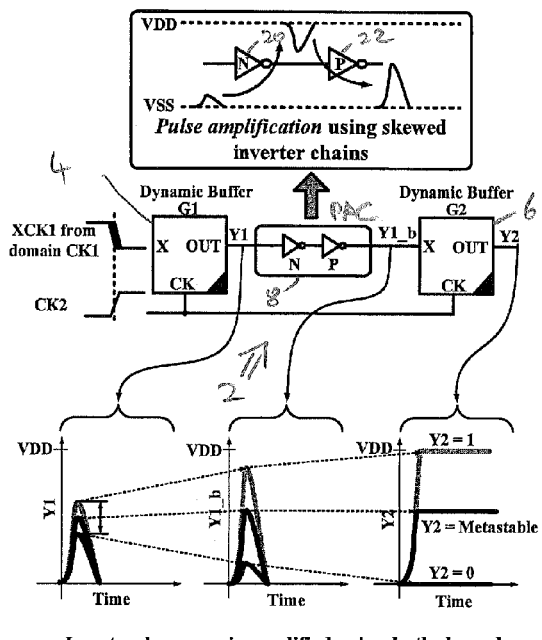
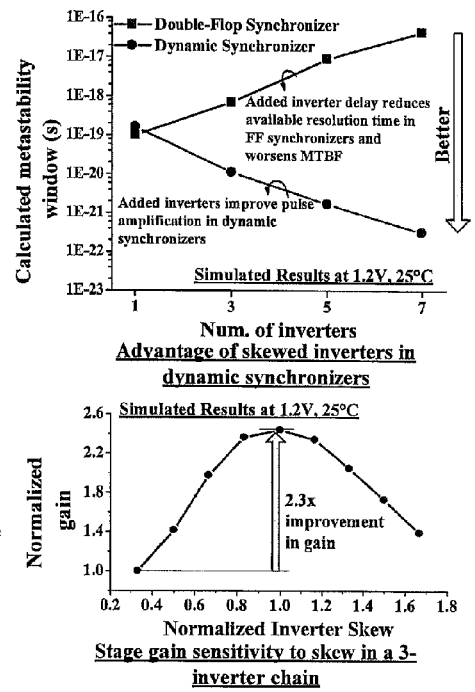
XCK1 = input signal
G1 = first circuit stage
Y1 = first stage state signal
PAC = pulse amplifying circuitry
Y1_b = pulse amplified signal
G2 = second circuit stage
Y2 = output signal
Fig. 3

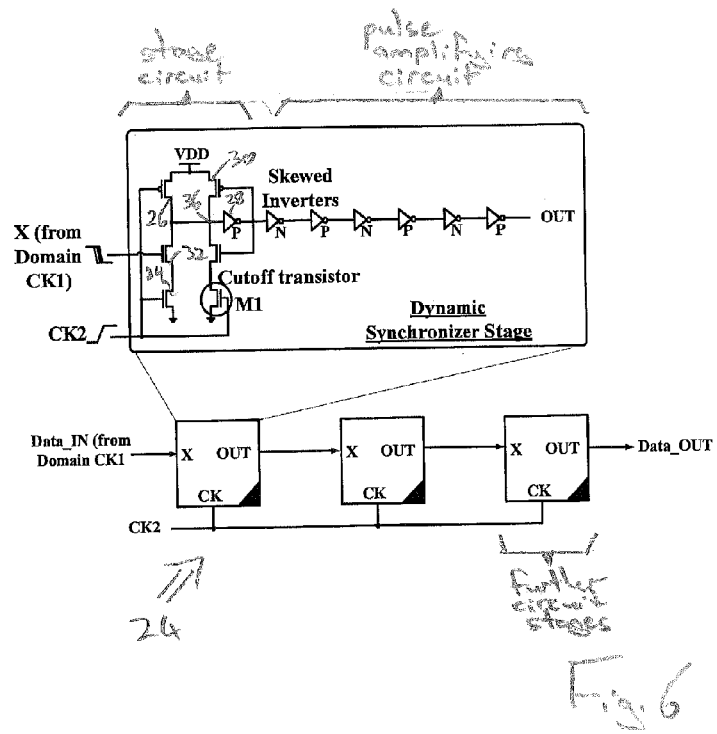
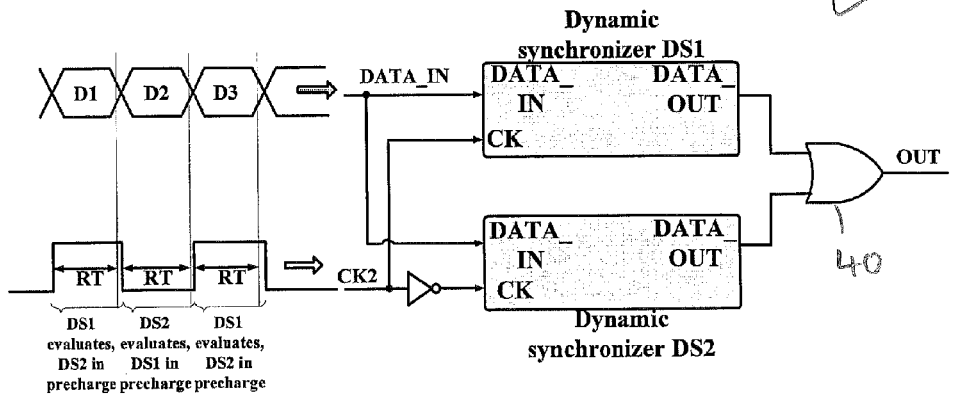
The two synchronizers work in a Ping-Pong manner. When Dynamic synchronizer DS1 precharges, DS2 enters the evaluate phase to hide this precharge latency.

DYNAMIC CIRCUITRY USING PULSE AMPLIFICATION TO REDUCE METASTABILITY

BACKGROUND OF THE INVENTION

1. Field of the Invention

This invention relates to the field of circuitry for processing digital signals. More particularly, this invention relates to dynamic circuitry having state signal which is reset to a predetermined value and then selectively changed from that predetermined value in dependence upon an input signal value.

2. Description of the Prior Art

A known problem within circuitry for processing digital signals is metastability. Metastability can arise when a signal value is sampled at a time close to when that signal value undergoes a transition. For example, a buffer circuit as illustrated in FIG. 1 of the accompanying drawings may serve as a synchroniser between clock domains and uses conventional flip-flops rather than dynamic circuits (buffers). The circuitry of FIG. 1 is configured to sample an input signal DCK1 from clock domain CK1 upon the rising edge of a different clock signal CK2. As illustrated in FIG. 1, if the input signal DCK1 undergoes a transition close to the rising edge of the clock signal CK2, then the output of the first flip-flop DFF1 can become metastable and adopt an intermediate signal value rather than clearly adopting either the high voltage state or the low voltage state. The metastability of the signal Q1 output from the first flip-flop DFF1, may then go on to produce metastability in the output of the second flip-flop DFF2 as illustrated. Such metastability problems become more of a concern when the design of a circuit is such that the proper value for the input signal DCK1 will not settle until shortly before the time at which it will be sampled. Indeed, in order to increase the performance of some circuits, it is known to increase the clock frequency to reach a limiting condition in which input signals to be sampled settle to their true values just before the time at which they are sampled. While this approach may increase the performance of the circuitry, it also increases the probability of errors occurring due to metastability as illustrated in FIG. 1.

SUMMARY OF THE INVENTION

Viewed from one aspect the present invention provides circuitry for receiving an input signal having an input signal value and for generating an output signal having an output signal value dependent upon said input signal value, said buffer circuit comprising:

a first circuit stage configured to receive said input signal and to generate a first stage state signal in dependence upon said input signal;

pulse amplifying circuitry configured to receive and to pulse amplify said first stage state signal to generate a pulse amplified signal having a pulse amplified signal value such that a pulse in said first stage state signal, during which said first stage state signal changes from a first state signal value toward a second state signal value and then returns to said first state signal value, is amplified;

a second circuit stage comprising:
  second stage reset circuitry configured to reset a second stage state signal to a second stage reset signal value during a second stage reset period;

output capture circuitry configured to receive said pulse amplified signal during a second stage evaluation period and:
  (i) if said pulse amplified signal value has a first value, then to leave said second stage state signal at said second stage reset signal value; and
  (ii) if said pulse amplified signal value has a second value, then to change said second stage state signal from said second stage reset signal value to a second stage set signal value; and output generating circuitry configured to generate said output signal in dependence upon said second stage state signal.

The present technique provides circuitry including at least a second circuit stage configured as a dynamic circuit. Such a dynamic stage is reset to provide a reset signal value during a reset period and then during an evaluation period that signal value is selectively changed to a set signal value if a received input to the stage has a predetermined value. Once the reset signal value has changed to the set signal value, then it does not change back during the evaluation period, even if the input signal value changes. While this approach has less vulnerability to metastability arising from the precise timing of an input signal relative to a sampling clock edge as illustrated in FIG. 1, and instead evaluates the input signal over a more extended evaluation period, the dynamic stage has a vulnerability to metastability caused by pulses in the signal being detected. A pulse in the signal being detected may have a magnitude and a duration such that the signal value being controlled by the second stage does not fully change from the reset signal value to the set signal value. This produces metastability in the output of the second stage. In order to address this problem, the present technique provides pulse amplifying circuitry configured to receive the signal to be evaluated by the second stage and to amplify pulses in that signal prior to passing pulse amplified signal values so generated onto the second circuit stage where the pulse amplified signal value serves to selectively switch the second circuit stage from the reset state to the set state. The action of the pulse amplifying circuitry is that pulses having greater than a predetermined magnitude are increased in magnitude and pulses having less than a predetermined magnitude are diminished in magnitude. This reduces the range (likelihood) of pulses that can cause problematic metastability pulses that without the action of the amplifying circuitry cause metastability are now mostly either increased in magnitude so that they fully switch the second stage or are reduced in magnitude such that the second stage is clearly not switched. The greater the magnitude of the amplification provided by the pulse amplifying circuitry, the less the statistical likelihood of metastability arising as a consequence of a certain range of pulses in the signal being sampled by the second circuit stage.

It will be appreciated that the second circuitry stage described above is a dynamic circuit which is reset to have a reset state and is then changed to the set state in dependence upon an input signal value. The first circuit stage, which receives the input signal into the circuitry as a whole, could have a variety of different forms. In some forms of the present technique, this first circuit stage is also a dynamic circuit with its own reset and set states. In such embodiments, the pulse amplifying circuitry is disposed between two dynamic buffer stages.

In embodiments in which the circuitry in accordance with the present technique is to be used as a buffer between two domains (e.g. clock domains or voltage domains), then this may be conveniently achieved by providing that the first stage reset period and the second stage reset period at least partially overlap and that the first stage evaluation period and the second stage evaluation period at least partially overlap. In this way, an input signal can be passed through to the output of the circuitry with a low delay.

The coordination between the action of the first stage and the second stage may be achieved when the first stage reset circuitry and the second stage reset circuitry are configured to be driven by a shared clock signal with a first phase of that shared clock signal corresponding to the first stage reset period and the second stage reset period and a second phase of that shared clock signal corresponding to the first stage evaluation period and the second stage evaluation period. The shared clock signal coordinates the action of the first stage circuitry and the second stage circuitry.

The dynamic circuitry forming the second stage circuitry may be provided using a second stage node which is precharged to the reset signal value and then selectively discharged to a set signal value in dependence upon the pulse amplified signal value. Keeper circuitry may be associated with the second stage node to hold the second stage node at the reset signal value unless the keeper circuitry is overcome by the output capture circuitry and the second stage node is discharged.

In embodiments in which the first stage circuitry is also dynamic, then a similar arrangement of a first stage node and first stage keeper circuitry may be employed therein.

The present technique may be used with only first stage circuitry and second stage circuitry having pulse amplifying circuitry disposed between. However, in other embodiments, it is possible that one or more further circuit stages may be provided and serially connected between the second circuit stage and the output generating circuitry. Further pulse amplifying circuitry may be disposed between some or all of the adjacent circuit stages in the arrangement where one or more further circuit stages are provided.

It will be appreciated that the pulse amplifying circuitry can have a variety of different forms. In one example form, the pulse amplifying circuitry may be of a skewed inverter circuit that is configured to drive the pulse amplifying signal to change with a greater drive strength in a first direction than in an opposite direction. Other forms of pulse amplifying circuitry are also possible, and may be mixed with, or used instead of, skewed inverters.

In one embodiment the pulse amplifying circuitry may comprise a chain of skewed inverters with adjacent skewed inverters within the chain having drive strengths skewed in opposite directions.

While the present circuitry can have a variety of different possible uses, one particular use is as a synchroniser for synchronising an input signal from a first clock domain to a clock signal of a second clock domain. In this context, the circuitry of the present technique provides a reduced vulnerability to metastability when there is a change in clock domain. Such a form of the circuitry is a synchronising buffer circuit.

The problems associated with metastability are increased embodiments in which input generating circuitry is configured to dynamically tune the input signal such that a valid transition of the input signal value completes at a time corresponding to the beginning of the first stage evaluation period. Such embodiments may be using the "Razor" techniques described in WO-A-2004/084072. Such embodiments the present technique has a strong advantage of reducing the vulnerability of the metastability.

Circuitry in accordance with the present techniques may be employed in pairs to produce two synchronisers working in a ping-pong manner to provide synchronisation between clock domains such that when first circuitry in accordance with the present technique is in its evaluation period, second circuitry associated with the present technique is in its reset period and vice versa.

Viewed from another aspect the present invention provides circuitry for receiving an input signal having an input signal value and for generating an output signal having an output signal value dependent upon said input signal value, said buffer circuit comprising:

first circuit stage means for receiving said input signal and for generating a first stage state signal in dependence upon said input signal;

pulse amplifying circuitry for receiving and for pulse amplifying said first stage state signal to generate a pulse amplified signal having a pulse amplified signal value such that a pulse in said first stage state signal, during which said first stage state signal changes from a first state signal value toward a second state signal value and then returns to said first state signal value, is amplified;

a second circuit stage comprising:

second stage reset means for resetting a second stage state signal to a second stage reset signal value during a second stage reset period;

output capture means for receiving said pulse amplified signal during a second stage evaluation period and:

(i) if said pulse amplified signal value has a first value, then leaving said second stage state signal at said second stage reset signal value; and (ii) if said pulse amplified signal value has a second value, then changing said second stage state signal from said second stage reset signal value to a second stage set signal value; and output generating means for generating said output signal in dependence upon said second stage state signal.

Viewed from a further aspect the present invention provides a method of operating circuitry for receiving an input signal having an input signal value and for generating an output signal having an output signal value dependent upon said input signal value, said method comprising the steps of:

receiving at a first circuit stage said input signal and generating a first stage state signal in dependence upon said input signal;

pulse amplifying said first stage state signal to generate a pulse amplified signal having a pulse amplified signal value such that a pulse in said first stage state signal, during which said first stage state signal changes from a first state signal value toward a second state signal value and then returns to said first state signal value, is amplified;

resetting a second stage state signal to a second stage reset signal value during a second stage reset period;

receiving said pulse amplified signal during a second stage evaluation period and:

(i) if said pulse amplified signal value has a first value, then leaving said second stage state signal at said second stage reset signal value; and (ii) if said pulse amplified signal value has a second value, then changing said second stage state signal from said second stage reset signal value to a second stage set signal value; and generating said output signal in dependence upon said second stage state signal.

The above, and other objects, features and advantages of this invention will be apparent from the following detailed description of illustrative embodiments which is to be read in connection with the accompanying drawings.

BRIEF DESCRIPTION OF THE DRAWINGS

FIG. 3 schematically illustrates the use of pulse amplification circuitry to reduce the susceptibility to metastability of a synchroniser circuit comprising two dynamic buffers;

FIG. 6 schematically illustrates a dynamic buffer stage including a chain of skewed inverters;

FIG. 7 schematically illustrates two synchronisers working in a ping-pong manner to serve as a synchroniser between two clock domains.

DESCRIPTION OF THE EMBODIMENTS

Figure 2:
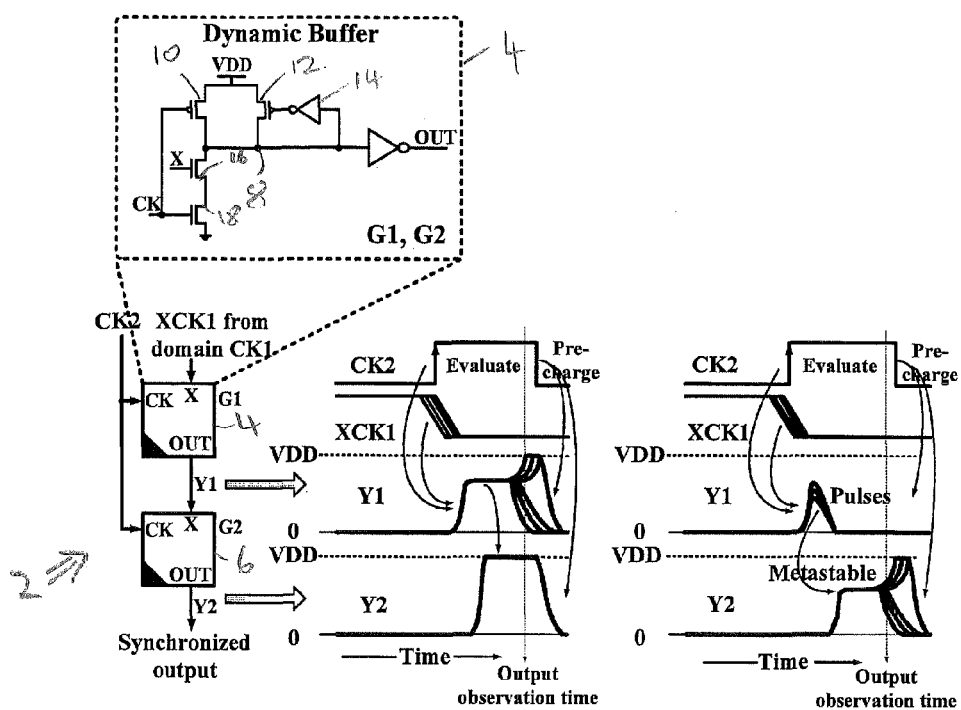
FIG. 2 schematically illustrates the occurrence of metastability within a synchroniser circuit comprising two dynamic buffers.

FIG. 2 illustrates synchroniser circuitry 2 for synchronising an input signal XCK1 from a first clock domain operating with a clock signal CK1 so as to form an output signal Y2 in a second clock domain operating with a clock signal CK2. The synchroniser circuitry 2 comprises two dynamic buffer circuits 4, 6. The first dynamic buffer circuit 4 is shown in an exploded view in FIG. 2. The first buffer circuit serves to charge a first node 8 to a high signal value (VDD) during the low phase of the clock signal CK through a P-type transistor 10. Feedback circuitry comprising a small P-type transistor 12 and an inverter 14 serve as keeper circuitry to hold the first node 8 at this high signal value (VDD) unless the keeper circuitry 12, 14 is overcome by the action of N-type transistors 16, 18. During the high phase of the clock signal CK, if the input signal X is also high, then both of the N-type transistors 16, 18 are conductive and the first node 8 will be discharged to ground. The low phase of the clock signal CK corresponds to the reset period of the dynamic buffer 4 and the high phase of the clock signal CK corresponds to the evaluate period.

Figure 1:
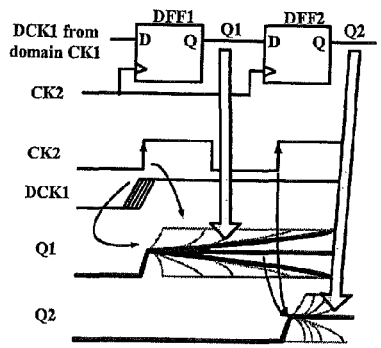
FIG. 1 schematically illustrates the occurrence of metastability within a buffer formed of two standard flip-flop circuits.

Illustrated in FIG. 2 is Scenario 1 corresponding to the situation illustrated in FIG. 1 which gave rise to metastability in a synchroniser circuit comprising two standard flip-flop circuits. In this case, if the input signal is transitioning at the start of the evaluate period, then output of the first stage Y1 may not immediately resolve. However, as the evaluate period continues it is likely that the signal Y1 will resolve away from a metastable state. However, even during the period when the output of the first stage 4 is still unresolved, and the signal Y1 has an intermediate voltage value, the nature of the dynamic buffers is such that the second stage 6 will respond to such an intermediate voltage in a manner in which the output Y2 of the second stage 6 is fully resolved and accordingly there is no metastability in the output of the synchroniser 2 as a whole.

Scenario 2 in FIG. 1 illustrates a form of metastability that can arise in the synchroniser 2 of FIG. 2. This metastability arises as a consequence of a pulse occurring in the output Y1 of the first stage 4 resulting in partial evaluation of the dynamic node (first node 8) and pull up by the keeper circuitry 12, 14. If the input signal XCK1 is such that a short duration pulse occurs in the output Y1 of the first stage 4, then this short duration pulse can result in the second stage 6 becoming metastable as its state node may be only partially discharged and its output signal Y2 may not have fully resolved by the output observation time expected form the synchroniser 2. Accordingly, while metastability arising for the reason illustrated in FIG. 1 does not occur with the dynamic buffer circuit of FIG. 2, there is a different potential type of metastability as a consequence of a pulse occurring in an intermediate signal between the synchroniser stages, as illustrated in Scenario 2 of FIG. 2.

FIG. 3 schematically illustrates synchroniser circuitry 2 formed of a first stage 4 and a second stage 6 with pulse amplifying circuitry 8 disposed therebetween. This pulse amplifying circuitry 8 is formed of a serially connected chain of skewed inverter circuits 20, 22, which alternate between being N-skewed and being P-skewed. The action of such skewed inverters 20, 22 is to amplify a pulse of greater than a predetermined magnitude passing along the chain of skewed inverters 20,22 as is illustrated in FIG. 3. A pulse of less than a predetermined magnitude will be made smaller by the action of the skewed inverters 20, 22. As any pulse which does arise in the output of the first stage 4 is amplified in this way, the second stage 6 is less likely to enter a metastable state as it receives a pulse of a greater magnitude increasing the probability that its state node will be fully discharged or a pulse that is too small to partially discharge its state node in a problematic manner.

FIG. 3 illustrates an input signal XCK1 received by the first stage 4 together with a clock signal CK2 of the target domain. Output from the first stage 4 corresponds to a first stage state signal Y1. This first stage state signal Y1 is passed to the pulse amplifying circuitry 8 where it is subject to pulse amplification as illustrated in FIG. 3. The pulse amplified signal Y1_b is supplied as an input to the second stage 6. The output from the second stage 6 is signal Y2. The second stage 6 includes output generating circuitry, which generates this output signal Y2 in dependence upon a second stage state signal within the second stage 6. In some embodiments it is possible that the output signal Y2 could be directly formed by the second stage state signal, in which case the output generating circuitry may simply be a conductor passing the second stage state signal out from the second stage 6.

The graphs illustrated in FIG. 3 illustrate how the calculated metastability window in the case of a double flip-flop standard synchroniser compares with that of a dynamic synchroniser with the pulse amplification circuitry as illustrated in FIG. 3 varies as the number of skewed inverters provided between the stages increases. In the case of standard flip-flop circuitry, the addition of the skewed inverters reduces the available resolution time in the flip-flop synchronisers, thereby increasing the metastability window and worsening the mean time before failure of the synchroniser. Conversely, in the case of the dynamic stage synchronisers illustrated in FIG. 3, the addition of the skewed inverters improves pulse amplification and accordingly reduces the metastability window and improves the mean time before failure of the synchroniser.

FIG. 3 further includes a graph illustrating how the gain of a skewed inverter stage varies with the degree of skew present within the inverter stage. This graph illustrates how a skew increases the normalised gain first increases and then starts to decrease. While skew alignment improves gain, the present technique does not require such skew alignment to be optimised.

Figure 4:
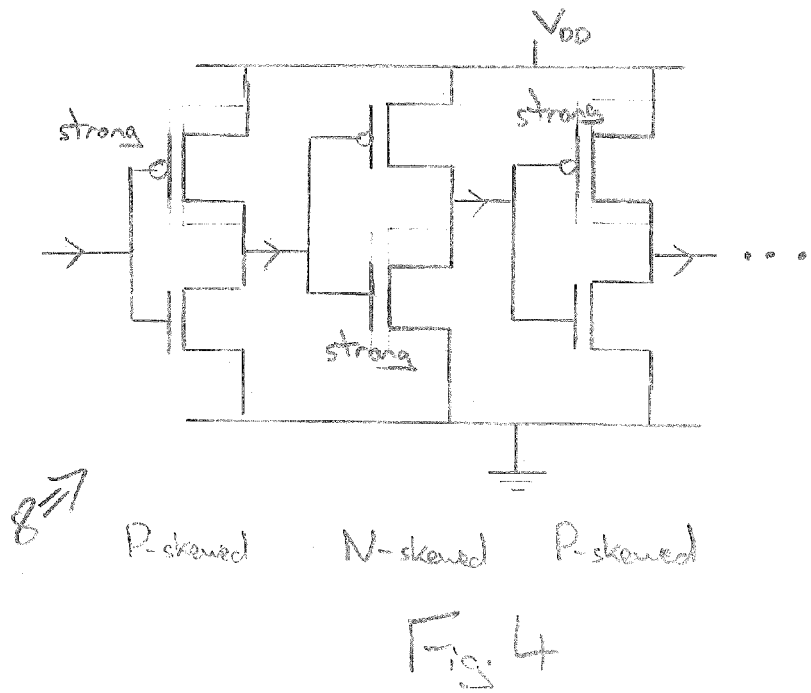
FIG. 4 schematically illustrates a chain of skewed inverters serving as pulse amplifying circuitry.

FIG. 4 schematically illustrates pulse amplification circuitry 8 in the form of a serially connected chain of skewed inverters. The inverters are skewed by virtue of one of the transistors within each inverter stack being stronger than the other transistor within that same stack. In a P-skewed inverter, the P-type transistor is stronger than the N-type transistor. The converse is true in an N-skewed inverter.

Figure 5:
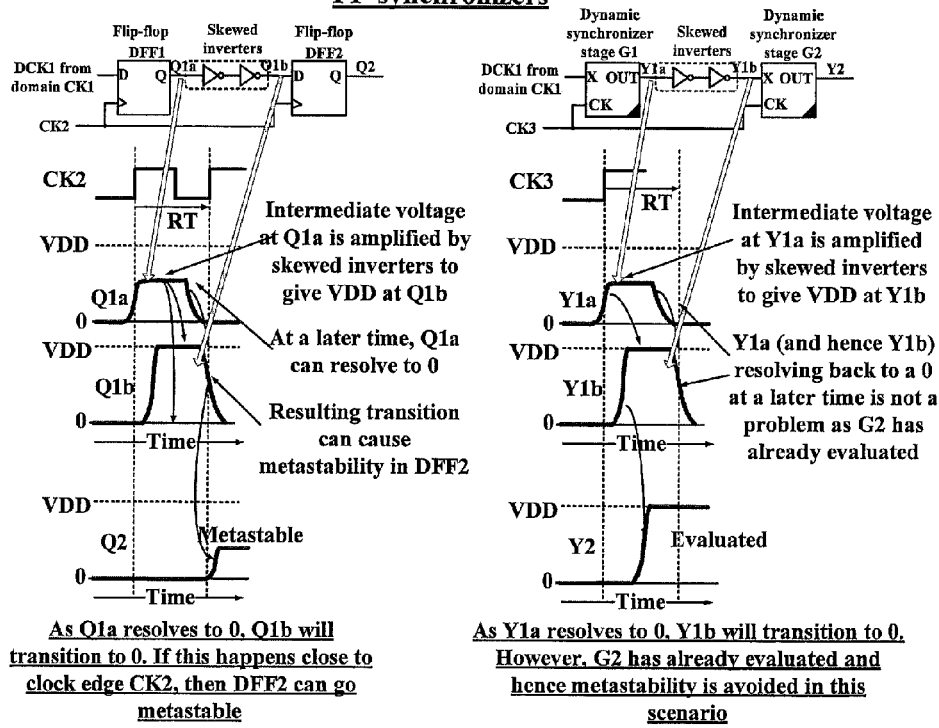
FIG. 5 is a diagram schematically illustrating how pulse amplification between stages reduces metastability when used with dynamic buffers, but does not have this effect when used with standard flip-flops.

FIG. 5 schematically illustrates how pulse amplification between synchroniser stages helps reduce the likelihood of metastability when the synchroniser stages are dynamic synchroniser stages (right hand side of FIG. 5), whereas in the case of a synchroniser formed of conventional flip-flops, and including pulse amplification circuitry, the effect of pulse amplification can be to increase the susceptibility to metastability (left hand side of FIG. 5). In the case of the dynamic synchroniser stages, the effect of pulse amplification is to amplify a signal Y1$a$ to form a signal Y1$b$ with a larger magnitude when the signal Y1$a$ has greater than a predetermined magnitude (the amplifying circuitry also acts to suppress small pulses that have less than a predetermined magnitude). The larger magnitude of the signal Y1$b$ has the effect of reducing the likelihood that the output from the second stage Y2 will be metastable, as even if the pulse Y1$b$ resolves back to a value of "0", then a magnitude of the duration of this pulse (the "impulse") is sufficiently large that the second stage dynamic synchroniser will have fully resolved and evaluated the output signal Y2 to a non-metastable value.

In contrast to the behaviour of the dynamic synchroniser stages in response to pulse amplification, conventional flip-flop circuits can degrade in performance as an amplified pulse Q1$b$ can result in a falling edge of that pulse occurring at the time at which the second flip-flop stage is sampling its input, and this can result in the output of the second stage Q2 becoming metastable.

FIG. 6 schematically illustrates synchroniser circuitry 24 comprising more than two dynamic stages (e.g. in this example three dynamic stages). Each of the dynamic stages includes stage reset circuitry in the form of a P-type transistor 26. Keeper circuitry is provided by the inverter 28 and a small P-type transistor 30. Output capture circuitry is provided by N-type transistors 32, 34 which selectively discharge a stage node 36 during an evaluation period when a clock signal CK2 is high. When the clock signal CK2 is low, this is the reset period during which the reset circuitry in the form of the P-type transistor 26 serves to charge the stage node 36 high to the VDD voltage. Each dynamic synchroniser stage includes a serially connected chain of skewed inverters (N, P, N, P, N, P) which serves as pulse amplifying circuitry. The final inverter may also be considered to serve as output generating circuitry to generate an output signal, at least in the case of the final stage within the synchroniser circuitry 24. A cut-off transistor M1 serves to improve the characteristics of the signal on the stage node 36 when switching between its high (reset) state and its low (set) state.

FIG. 7 schematically illustrates a buffer unit 38 in the form of two dynamic synchronisers (each comprising multiple dynamic stages) connected back-to-back in a ping-pong manner. When dynamic synchroniser DS1 is in its reset period, dynamic synchroniser DS2 is in its evaluate period. The converse is true when the controlling clock signal CK2 changes its phase. In this manner, the dynamic synchroniser always serves to pass a data_in signal it receives through the buffer unit 38 to an OR gate 40 which generates an output signal. Accordingly, the latency associated with pre-charging the individual dynamic synchronisers may be hidden.

Figure 8:
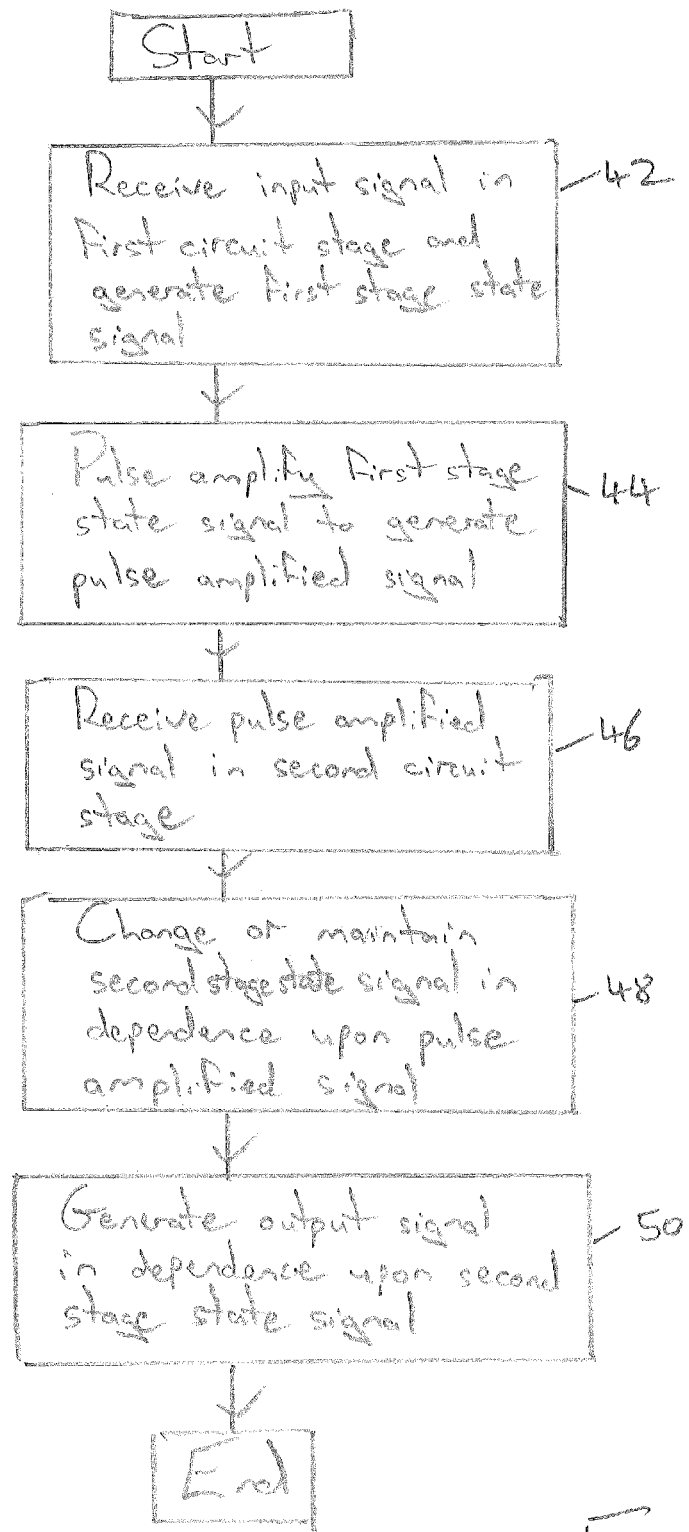
FIG. 8 is a flow diagram schematically illustrating operation of the circuitry of FIG. 4.

FIG. 8 is a flow diagram schematically illustrating the operation of dynamic synchronising circuitry illustrated in FIG. 3. At step 42, an input signal is received at the first circuit stage and serves to generate a first stage state signal at a first stage node. At step 44 the pulse amplifying circuitry 8 serves to pulse amplify the first stage state signal to generate a pulse amplified signal. The first stage state signal may remain at its reset value, in which case the pulse amplification circuitry 8 has no effect. Another possibility is that the first stage state signal may discharge to its set value. In this case the pulse amplification circuitry 8, may have the effect of increasing in the rate of change of the signal supplied to the second stage up to the point where it reaches the set value, and then remains at the set value. Another possibility is that the first stage state signal shows a pulse behaviour in which it changes and moves away from the reset value towards the set value, and then returns to the reset value. In this situation the pulse amplification circuitry serves to increase the magnitude of the pulse corresponding to these changes and with a predetermined range of magnitudes, as is illustrated in FIG. 3. The pulse amplified signal which is so generated has an increased probability of causing a full transition in the second stage thereby reducing the probability of metastability arising in the output of the second stage. Pulses that are too small are suppressed by the pulse amplification.

At step 46 the pulse amplified signal is received by the second circuit stage 6. At step 48 the second circuit stage either changes or maintains the second stage state signal in dependence upon the pulse amplified signal that is received. The pulse amplified signal may not necessarily contain a pulse, but any pulse therein will be amplified in magnitude. At step 50, an output signal is generated in dependence upon the second stage state signal. In some embodiments the second stage state signal could directly serve as the output signal.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Circuitry for receiving an input signal having an input signal value and for generating an output signal having an output signal value dependent upon said input signal value, said buffer circuit comprising:

a first circuit stage configured to receive said input signal and to generate a first stage state signal in dependence upon said input signal;

pulse amplifying circuitry configured to receive and to pulse amplify said first stage state signal to generate a pulse amplified signal having a pulse amplified signal value such that a pulse in said first stage state signal, during which said first stage state signal changes from a first state signal value toward a second state signal value and then returns to said first state signal value, is amplified;

a second circuit stage comprising:

second stage reset circuitry configured to reset a second stage state signal to a second stage reset signal value during a second stage reset period;

output capture circuitry configured to receive said pulse amplified signal during a second stage evaluation period and:
  (i) if said pulse amplified signal value has a first value, then to leave said second stage state signal at said second stage reset signal value; and
  (ii) if said pulse amplified signal value has a second value, then to change said second stage state signal from said second stage reset signal value to a second stage set signal value; and
output generating circuitry configured to generate said output signal in dependence upon said second stage state signal.

2. Circuitry as claimed in claim 1, wherein said first circuit stage comprises:
first stage reset circuitry configured to reset a first stage state signal to a first stage reset signal value during a first stage reset period; and
input detecting circuitry configured to receive said input signal during a first stage evaluation period and:
  (i) if said input signal value has a third value, then to change said first stage state signal from said first stage reset signal value to a first stage set signal value; and
  (ii) if said input signal value has a fourth value, then to leave said first stage state signal at said first stage reset signal value.

3. Circuitry as claimed in claim 2, wherein said first stage reset period and said second stage reset period at least partially overlap and said first stage evaluation period and said second stage evaluation period at least partially overlap.

4. Circuitry as claimed in claim 3, wherein said first stage reset circuitry and said second stage reset circuitry are configured to be driven by a shared clock signal, a first phase of said shared clock signal corresponding to said first stage reset period and said second stage reset period and a second phase of said shared clock signal corresponding to said first stage evaluation period and said second stage evaluation period.

5. Circuitry as claimed in claim 1, wherein second stage reset circuitry is configured to precharge a second stage node to said second stage reset signal value during said second stage reset period and said output capture circuitry is configured to discharge said second stage node toward said second stage set signal value if said pulse amplified signal value has said first value during said second stage evaluation period.

6. Circuitry as claimed in claim 5, comprising second stage keeper circuitry configured to maintain said second stage node at said second stage reset signal value during said second stage evaluation period unless said output capture circuitry overcomes said second stage keeper circuitry and discharges said second stage node.

7. Circuitry as claimed in claim 2, wherein first stage reset circuitry is configured to precharge a first stage node to said first stage reset signal value during said first stage reset period and said input detecting circuitry is configured to discharge said first stage node toward said first stage set signal value if said input signal value has said third value during said first stage evaluation period.

8. Circuitry as claimed in claim 7, comprising first stage keeper circuitry configured to maintain said first stage node at said first stage reset signal value during said first stage evaluation period unless said input detecting circuitry overcomes said first stage keeper circuitry and discharges said first stage node.

9. Circuitry as claimed in claim 1, comprising one or more further circuit stages serially connected between said second circuit stage and said output generating circuitry and pulse amplifying circuitry disposed between some or all adjacent circuit stages and configured to pulse amplify any pulse in a signal passed between said adjacent circuit stages.

10. Circuitry as claimed in claim 1, wherein said pulse amplifying circuitry comprises at least one skewed invertor circuit configured to drive said pulse amplified signal value to change with a greater drive strength in a first direction, in response to said first stage state signal changing from said first stage reset signal value toward said first stage set signal value, than in a second direction opposite to said first direction.

11. Circuitry as claimed in claim 10, wherein said pulse amplifying circuitry comprises a chain of skewed invertor circuits.

12. Circuitry as claimed in claim 11, wherein adjacent skewed invertor circuits within said chain have drive strengths skewed in opposite directions.

13. Circuitry as claimed in claim 1, wherein said second circuit stage is vulnerable to metastability if said first stage state signal value includes a pulse during said first stage evaluation period and said pulse amplification of said first stage state signal by said pulse amplifying circuitry reduces a probability of said metastability arising.

14. Circuitry as claimed in claim 1, wherein said circuitry is synchroniser circuitry configured to synchronise said input signal from a first clock domain with a clock signal of a second domain to generate said output signal.

15. Circuitry as claimed in claim 1, wherein said circuitry is configured as buffer circuitry.

16. Processing circuitry comprising:
circuitry as claimed in claim 2, and
input generating circuitry configured to dynamically tune said input signal such that a valid transition in said input signal value completes at a time corresponding to a beginning of said first stage evaluation period.

17. A buffer unit comprising:
first circuitry as claimed in claim 1, and
second circuitry as claimed in claim 1, wherein
said first circuitry and said second circuitry share said input signal and share said output signal;
said first stage reset period of said first circuitry corresponds to said first stage evaluation period of said second circuitry;
said first stage evaluation period of said first circuitry corresponds to said first stage reset period of said second circuitry;
said second stage reset period of said first circuitry corresponds to said second stage evaluation period of said second circuitry; and
said second stage evaluation period of said first circuitry corresponds to said second stage reset period of said second circuitry.

18. Circuitry for receiving an input signal having an input signal value and for generating an output signal having an output signal value dependent upon said input signal value, said buffer circuit comprising:
first circuit stage means for receiving said input signal and for generating a first stage state signal in dependence upon said input signal;
pulse amplifying circuitry for receiving and for pulse amplifying said first stage state signal to generate a pulse amplified signal having a pulse amplified signal value such that a pulse in said first stage state signal, during which said first stage state signal changes from a first state signal value toward a second state signal value and then returns to said first state signal value, is amplified;

a second circuit stage comprising:

second stage reset means for resetting a second stage state signal to a second stage reset signal value during a second stage reset period;

output capture means for receiving said pulse amplified signal during a second stage evaluation period and:
  (i) if said pulse amplified signal value has a first value, then leaving said second stage state signal at said second stage reset signal value; and
  (ii) if said pulse amplified signal value has a second value, then changing said second stage state signal from said second stage reset signal value to a second stage set signal value; and output generating means for generating said output signal in dependence upon said second stage state signal.

19. A method of operating circuitry for receiving an input signal having an input signal value and for generating an output signal having an output signal value dependent upon said input signal value, said method comprising the steps of:

receiving at a first circuit stage said input signal and generating a first stage state signal in dependence upon said input signal;

pulse amplifying said first stage state signal to generate a pulse amplified signal having a pulse amplified signal value such that a pulse in said first stage state signal, during which said first stage state signal changes from a first state signal value toward a second state signal value and then returns to said first state signal value, is amplified;

resetting a second stage state signal to a second stage reset signal value during a second stage reset period;

receiving said pulse amplified signal during a second stage evaluation period and:
  (i) if said pulse amplified signal value has a first value, then leaving said second stage state signal at said second stage reset signal value; and
  (ii) if said pulse amplified signal value has a second value, then changing said second stage state signal from said second stage reset signal value to a second stage set signal value; and generating said output signal in dependence upon said second stage state signal.

\* \* \* \* \*